(12) United States Patent
Ezzeddine

(10) Patent No.: US 7,864,014 B2
(45) Date of Patent: Jan. 4, 2011

(54) MODE-SWITCHING TRANSFORMER

(75) Inventor: Hilal Ezzeddine, Tours (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 10/699,100

(22) Filed: Oct. 30, 2003

(65) Prior Publication Data

US 2004/0130427 A1    Jul. 8, 2004

(30) Foreign Application Priority Data

Oct. 30, 2002    (FR)    ................................ 02 13611

(51) Int. Cl.
*H01F 5/00*    (2006.01)
(52) U.S. Cl. .................................... 336/200
(58) Field of Classification Search .................. 336/65, 336/83, 200, 206–208, 232
See application file for complete search history.

(56) References Cited

U.S. PATENT DOCUMENTS

| | | | | |
|---|---|---|---|---|
| 3,303,287 | A * | 2/1967 | Gouttebel et al. | ........... 370/244 |
| 3,836,852 | A * | 9/1974 | Ross | ........... 324/123 R |
| 4,054,829 | A * | 10/1977 | Searle | ........... 323/356 |
| 4,369,557 | A | 1/1983 | Vandebult | ........... 29/26.42 |
| 4,441,053 | A * | 4/1984 | Daspit | ........... 315/206 |
| 5,038,264 | A * | 8/1991 | Steigerwald | ........... 363/21.02 |
| 5,052,039 | A * | 9/1991 | Moisin | ........... 379/402 |
| 5,166,595 | A * | 11/1992 | Leverich | ........... 320/139 |
| 5,477,204 | A | 12/1995 | Li | ........... 336/200 |
| 5,497,137 | A | 3/1996 | Fujiki | ........... 336/200 |
| 5,541,957 | A * | 7/1996 | Lau | ........... 375/258 |
| 5,644,272 | A | 7/1997 | Dabrowski | ........... 333/26 |
| 5,697,088 | A | 12/1997 | Gu | |
| 5,834,902 | A * | 11/1998 | Deurloo et al. | ........... 315/209 R |
| 5,886,589 | A * | 3/1999 | Mourant | ........... 333/26 |
| 6,396,362 | B1 * | 5/2002 | Mourant et al. | ........... 333/25 |
| 6,529,363 | B2 | 3/2003 | Waffenschmidt et al. | |
| 2004/0169566 | A1 * | 9/2004 | Guitton et al. | ........... 333/25 |
| 2005/0264273 | A1 * | 12/2005 | Ezzedine | ........... 323/355 |

FOREIGN PATENT DOCUMENTS

| | | |
|---|---|---|
| EP | 0866513 | 9/1998 |
| EP | 1045469 | 10/2000 |
| EP | 1227537 | 7/2002 |
| JP | 61266069 A * | 11/1986 |

(Continued)

OTHER PUBLICATIONS

French Search Report, FR 0213611, Jun. 17, 2003.

(Continued)

*Primary Examiner*—Tuyen Nguyen
(74) *Attorney, Agent, or Firm*—Lisa K. Jorgenson; Kevin D. Jablonski; Graybeal Jackson LLP

(57) ABSTRACT

A mode-switching transformer comprising a first line in common mode and a second line in differential mode, each line comprising two sections in series respectively coupled with one of the two sections of the other line and all sections having the same lengths, the common mode line being connected in series with a capacitor, to lower the central frequency of the transformer passband, the λ/4 lengths of the sections being chosen to correspond to a central frequency greater than the central frequency desired for the transformer.

5 Claims, 2 Drawing Sheets

FOREIGN PATENT DOCUMENTS

JP   01047223 A * 2/1989

OTHER PUBLICATIONS

Yoon, Yeong J., et al., A Silicon Monolithic Spiral Transmission Line Balun with Symetrical Design, XP-000805728, Copyright 1999.

European Search Report for European Patent Application No. 02250408, dated Mar. 6, 2003.

Prieto D et al; "CPS structure potentialities for MMICs: a CPS/CPW transition and a bias network"; Microwave Symposium Digest, 1998 IEEE MTT-S International Baltimore, MD, USA; Jun. 7-12, 1998, New York, NY, USA, IEEEE, US pp. 111-114.

Schellenberg J et al: "Low-loss, planar monolithic baluns for K/Ka-band applications"; Microwave Symposium Digest, 1999 IEEE MTT-S International Anaheim, CA, USA Jun. 13-19, 1999, pp. 1733-1736.

* cited by examiner

MODE-SWITCHING TRANSFORMER

PRIORITY CLAIM

This application claims priority from French patent application No. 02/13611, filed Oct. 30, 2002, which is incorporated herein by reference.

BACKGROUND OF THE INVENTION

1. Field of the Invention

The present invention relates to the field of mode-switching transformers which are used to convert a voltage from a common mode to a differential mode and conversely.

2. Discussion of the Related Art

FIG. 1 is a schematical block diagram of a transformer of the type to which the present invention applies.

It is a structure for converting a common mode voltage Vc referenced to earth M or to ground into a differential voltage Vd provided between two output terminals 2, 3. A common mode input-output terminal 4 is, for example, floating (in an application to radiofrequency signal reception).

The present invention more specifically relates to such so-called distributed or BALUN (balanced-unbalanced) converters formed from coupled conductive tracks. Such converters are of so-called Marchand type and they are known to be wide-band converters.

FIG. 2 shows the electric diagram of a Marchand-type mode-switching converter to which the present invention applies. On the common mode side (inputs 4 and earth M), a first winding formed of two sections 5 and 6 of conducive spirals is coupled with a second winding also formed of two sections 7 and 8 on the differential mode side. Sections 7 and 8 are electrically in series between terminals 2 and 3 and exhibit a junction point 9 forming the ground of the differential mode (possibly isolated from the common mode earth). The lengths of the different windings are all identical, which characterizes a Marchand-type converter. These lengths are all equal to $\lambda/4$, where $\lambda$ corresponds to the wavelength of the central frequency of the passband of the considered converter.

The relation linking wavelength $\lambda$ to frequency is:

$$\lambda = c/f\sqrt{\in},$$

where c represents the velocity of light in vacuum, where $\in$ represents the substrate permittivity and where f represents the frequency (here, the central frequency of the desired passband).

In a converter of the type in FIG. 2, this central frequency is defined as being the median frequency of the passband corresponding to ±3 dB with respect to the minimum attenuation of the transformer.

An example of a Marchand-type mode-switching transformer to which the present invention applies is described, for example, in article "A Silicon Monolithic Transmission Balun with Symmetrical Design" by Yeong J. and Yichenglu, published in IEEE Electron Devices Letters, volume 20, N°4, in April 1999.

A disadvantage of mode-switching transformers formed of conductive tracks on different metallization levels in integrated structures is linked to the size taken up by these transformers. For example, for frequencies on the order of one gigahertz, it is frequent to have to size the lines with lengths of several centimeters, which is far from being negligible in the bulk of an integrated or printed circuit.

Another difficulty is the fact that the longer the sections, the higher the insertion losses. Now, in integrated applications (for example, mobile telephony), the received signals are often of small intensity and insertion losses thus must be minimized.

SUMMARY OF THE INVENTION

The present invention aims at providing a novel mode-switching transformer structure, of lesser bulk than conventional structures for a same central frequency.

The present invention also aims at providing such a transformer that can be formed by applying technologies of the type used in integrated circuit manufacturing.

The present invention also aims at providing a solution that decreases insertion losses.

To achieve these and other objects, the present invention provides a mode-switching transformer comprising a first line in common mode and a second line in differential mode, each line comprising two sections in series respectively coupled with one of the two sections of the other line and all sections having the same lengths, the common mode line being connected in series with a capacitor, to lower the central frequency of the transformer passband, the $\lambda/4$ lengths of the sections being chosen to correspond to a central frequency greater than the central frequency desired for the transformer.

According to an embodiment of the present invention, the value of capacitor C respects the following relation:

$$C = \frac{1}{2\pi f_0 Z_c tg(\beta L)},$$

where $f_0$ designates the central frequency of the desired passband, where L designates the length of the two sections in series calculated as $\lambda/2$ based on said central frequency greater than the desired central frequency, where $Z_C$ designates the characteristic line impedance, and where $\beta$ designates the phase constant.

According to an embodiment of the present invention, each section is a plane spiral, two first section being formed in a first conductive layer of a multilayer circuit and being laterally spaced from each other, the two other sections being also formed in said first conductive level and being respectively interlaced with the first sections, a least one armature of the capacitor being formed in said first conductive layer and connections being formed in a second conductive layer.

According to an embodiment of the present invention, the capacitor is located in the center of one of said spirals.

According to an embodiment of the present invention, the transformer is formed in two conductive levels separated by a dielectric, two sections and one armature of the capacitor being patterned in each metallization level.

According to an embodiment of the present invention, the transformer is applied to frequencies on the order of one gigahertz.

The foregoing objects, features, and advantages of the present invention will be discussed in detail in the following non-limiting description of specific embodiments in connection with the accompanying drawings.

DETAILED DESCRIPTION

Figure 1:
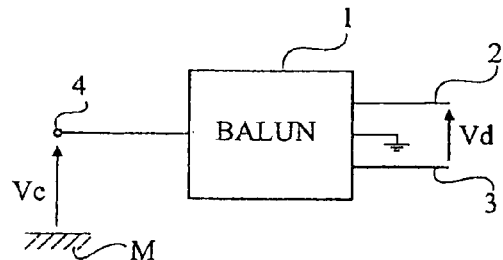
FIG. 1, previously described, shows the block diagram of a mode-switching transformer of the type to which the present invention applies.
Figure 2:
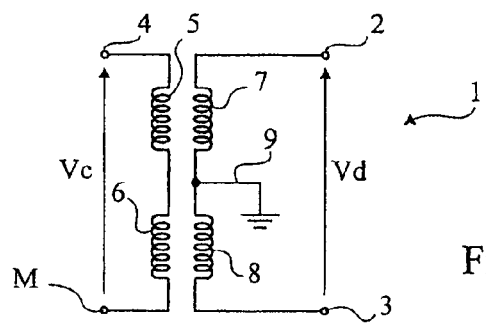
FIG. 2 shows the equivalent electric diagram of a conventional mode-switching transformer.

Same elements have been referred to with same reference numerals in the different drawings. For clarity, only those elements that are necessary to the understanding of the present invention have been shown in the drawings and will be described hereafter. In particular, the origin and destination of the signals converted by the mode-switching transformer have not been detailed and are no object of the present invention. The present invention applies whatever the type of signals to be processed. Further, the practical forming of the conductive tracks has not been detailed, the present invention being implementable by applying current technologies.

A feature of the present invention is to insert, between one end of the common mode winding and the earth, a capacitor. This capacitor enables reducing the central frequency of the passband of the formed transformer, even though its windings are sized for higher operating frequencies, and thus with a smaller length.

Figure 3:
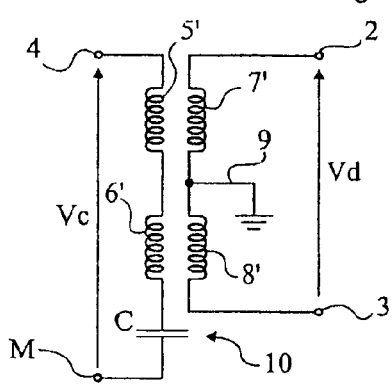
FIG. 3 shows the equivalent electric diagram of a mode-switching transformer according to the present invention.

FIG. 3 shows the equivalent diagram of a mode-switching transformer according to the present invention. As previously, such a converter 10 comprises a common mode input of application of a voltage Vc referenced to a earth M on a first terminal 4, and a differential mode output between two terminals 2 and 3 providing a voltage Vd.

In the diagram, the second differential mode winding, formed of conductive sections 7' and 8' between which is junction point 9 of the differential mode, is not modified with respect to a conventional transformer, apart from the lengths of sections 7' and 8' for a given central passband frequency.

On the common mode side, the present invention provides a capacitor C in series with the two sections 5' and 6' of the first winding.

A feature of the present invention is to size the conductive sections in $\lambda/4$, as a function of central wavelength $\lambda$ of the transformer passband, based on a frequency substantially greater than that for which this transformer is intended. Then, by introduction of capacitor C, the operating frequency of the transformer is lowered to the desired frequency band.

An advantage of such a structure is that by sizing the transformer for higher frequencies, the respective lengths of the conductive tracks are smaller.

Another advantage is that by decreasing the lengths of the conductive tracks, a decrease in the insertion losses of the transformer thus formed is induced.

The price to pay for the implementation of the present invention is a slight degradation of the transformer passband (that is, of the bandwidth of the formed transformer).

Figure 4:
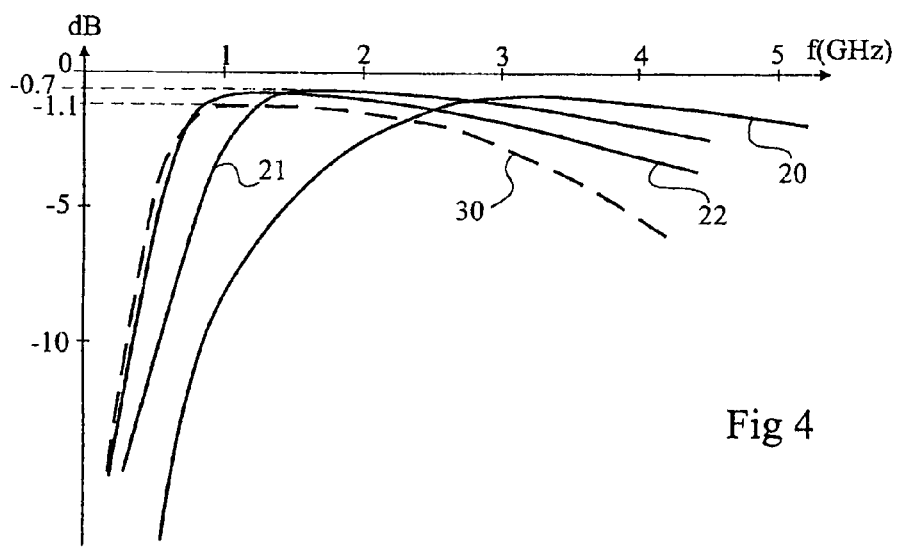
FIG. 4 shows different response curves of a mode-switching transformer according to the present invention.

FIG. 4 illustrates the implementation of the present invention by showing several frequency responses of mode-switching transformers. FIG. 4 shows the frequency response of three mode-switching transformers having conductive sections of identical lengths and sized with respect to a 3.5-GHz central frequency (curve 20), respectively assigned with a 1-picofarad capacitor (curve 21) and of a 2-picofarad capacitor (curve 22).

As appears from FIG. 4, with a 1-picofarad capacitor, central frequency of the transformer is brought down to approximately 1.5 GHz while, with a 2-picofarad capacitor, this central frequency is further lowered down to 0.9 GHz.

Although this is not shown in the drawing, the present inventors have noted that the respective insertion losses of the three transformers illustrated by respective curves 20, 21, and 22 are of −0.6 dB, −0.7 dB, and −0.9 dB. Insertion losses thus slightly increase with the introduction of capacitor C. However, and as illustrated by the curve in dotted lines 30 in FIG. 4, to form a transformer with a 1.5-GHz central frequency with no capacitor, insertion losses would be much higher (−1.1 dB). Accordingly, the addition of a capacitor with respect to a transformer sized for a higher frequency effectively results in a decrease in insertion losses with respect to a conventional transformer.

In the example of FIG. 4, the transformer has been formed on a glass substrate with two spirals in copper metallization levels, insulated from each other by a dielectric. In such a forming, a transformer sized to operate at 1.5 GHz (curve 30, FIG. 4) would take up a surface area of 3.2×1.6 mm². A transformer sized to operate at a 3.5 GHz frequency takes up a surface area of 2×1.1 mm². Further, the capacitor forming is particularly easy and requires no additional level. Indeed, it is possible to use the dielectric and the two metallization levels for its armatures.

Figure 5:
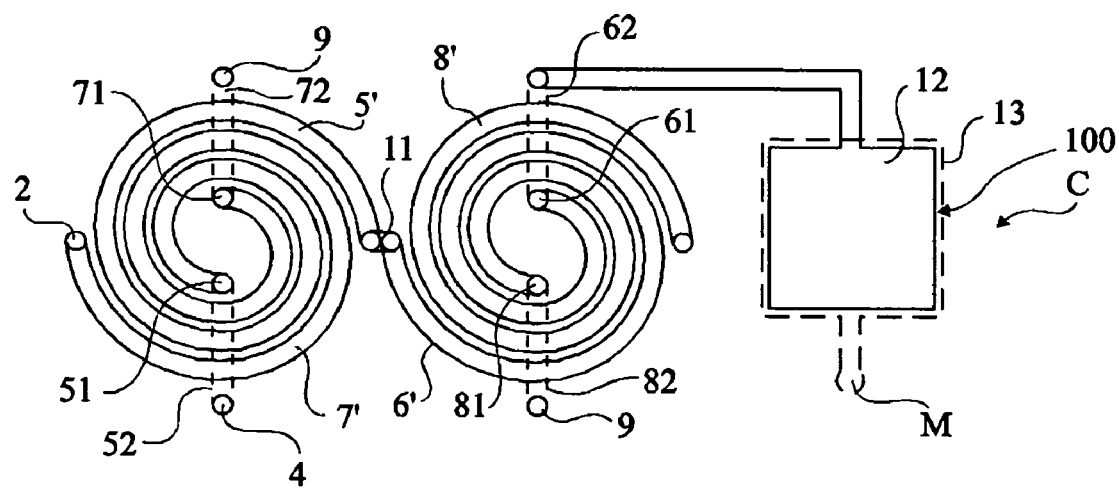
FIG. 5 shows a mode-switching transformer according to an embodiment of the present invention.

For example, as shown in FIG. 5, each section 5', 6', 7' and 8' is a plane spiral made in a conductive layer of a multilayer circuit. The two sections of a first line (preferably 5' and 6') are located side by side and connected (connection 11) in the same layer. The two sections 7' and 8' of the other line are respectively interlaced with one of the sections of the first line. Their respective central ends 51, 61, 71 and 81 are electrically connected to the outside of the structure with bridges 52, 62, 72 and 82 made in a second conductive layer (dotted line) connected to the first one by vias, which also realize the ground connection 9.

According to a first embodiment, the capacitor C is made external from the spirals, one of its armatures 12 and 13 being made in each conductive layer, and a bridge 62 connecting the end of section 6' which is on the center of one spiral.

Figure 6:
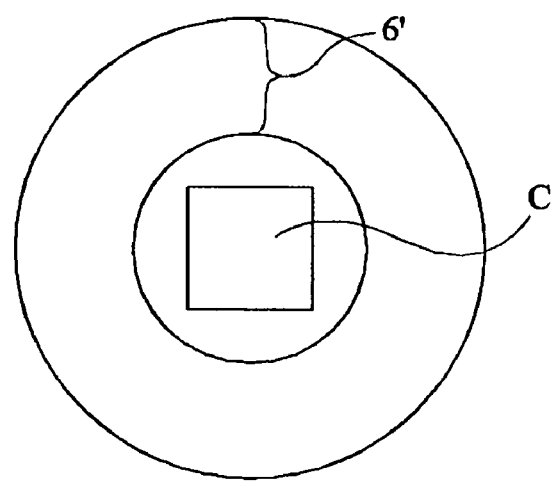
FIG. 6 shows a mode-switching transformer according to another embodiment of the present invention.

According to a second embodiment shown in FIG. 6, the capacitor C is located in the center of the spirals forming sections 5' and 6'. So, the connection of its armature to section 6' does not require a bridge. Another advantage is that it minimized the global size of the transformer.

Alternatively, a third conductive level is provided for one of the armatures of the capacitor, whenever it is located in the center or outside of the spirals.

Another advantage of the present invention which appears from FIG. 4 is that with a same transformer sized for a relatively high frequency, the central frequency of the transformer can be modified simply by changing the value of capacitor C. This results in a possibility of creating identical integrated circuit models for different applications.

To implement the present invention, the following relation may be applied to size the respective transformer components:

$$C = \frac{1}{2\pi f_0 Z_c tg(\beta L)},$$

where $f_0$ designates the central frequency of the desired passband, where L designates the length of each conductive track (cumulated length of sections 5', 6' and 7', 8') calculated as $\lambda/2$ (2*$\lambda/4$) based on a higher frequency than the desired central frequency $f_0$, where $Z_C$ designates the characteristic line impedance (assumed to be identical for each winding), and where β designates the phase constant.

The application of this relation to size a transformer specific to the present invention is within the abilities of those skilled in the art based on the functional indications given hereabove and according to its application. For example, the techniques described in the above-mentioned article may be used.

Of course, the present invention is likely to have various alterations, modifications, and improvements which will readily occur to those skilled in the art. In particular, the dimensions to be given to the windings of a mode-switching transformer according to the present invention, according to the desired operating frequency and to the capacitor introduced in series with the common mode, is within the abilities of those skilled in the art according to the application and to the functional indications given hereabove. Further, it should be noted that, in practice, several mode-switching transformers may be associated in series to increase the passband.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed:

1. A mode-switching transformer comprising a first line in common mode and a second line in differential mode, each line comprising two sections in series respectively coupled with one of the two sections of the other line and all sections having the same lengths, wherein the common mode line is connected in series with a capacitor, to lower a central frequency of a bandwidth of the transformer, the λ/4 lengths of the sections being chosen to correspond to a central frequency greater than a desired central frequency for the transformer; wherein the value of capacitor C respects the following relation:

$$C = \frac{1}{2\pi f_0 Z_c tg(\beta L)},$$

where $f_0$ designates the desired central frequency, where L designates the length of the two sections in series calculated in λ/2 from said central frequency greater than the desired central frequency, where $Z_c$ designates the characteristic line impedance, and where β designates the phase constant.

2. A mode-switching transformer, comprising:
a common mode winding;
a differential mode winding electromagnetically coupled with the common mode winding defining a central frequency; and
only one capacitor electrically coupled to the common-mode winding,
wherein the value of the capacitor is inversely proportional to the central frequency.

3. The mode-switching transformer of claim 2 wherein the differential mode windings comprise a length and the value of the capacitor is inversely proportional to the length.

4. The mode-switching transformer of claim 2 wherein the differential mode windings comprise an impedance and the value of the capacitor is inversely proportional to the impedance.

5. The mode-switching transformer of claim 2 wherein the differential mode windings comprise a phase constant and the value of the capacitor is inversely proportional to the phase constant.

* * * * *